(12) United States Patent
Durand et al.

(10) Patent No.: US 9,351,412 B2
(45) Date of Patent: May 24, 2016

(54) ELECTRICAL AND ELECTRONICS BAY OF AN AIRCRAFT WITH AN IMPROVED ARCHITECTURE AND AIRCRAFT INCORPORATING SAID BAY

(71) Applicant: Airbus Operations (SAS), Toulouse (FR)

(72) Inventors: Yves Durand, Aussonne (FR); Bernard Guering, Montrabe (FR)

(73) Assignee: Airbus Operations (SAS), Toulouse (FR)

( * ) Notice: Subject to any disclaimer, the term of this patent is extended or adjusted under 35 U.S.C. 154(b) by 79 days.

(21) Appl. No.: 14/138,543

(22) Filed: Dec. 23, 2013

(65) Prior Publication Data
US 2014/0175964 A1    Jun. 26, 2014

(30) Foreign Application Priority Data
Dec. 21, 2012   (FR) ...................................... 1262552

(51) Int. Cl.
*H05K 5/02* (2006.01)
*B64D 43/00* (2006.01)
*H05K 7/14* (2006.01)

(52) U.S. Cl.
CPC .............. *H05K 5/0217* (2013.01); *B64D 43/00* (2013.01); *H05K 7/1412* (2013.01)

(58) Field of Classification Search
CPC . H05K 7/1497; H05K 7/1412; H05K 5/0217; B64C 1/1407; B64C 1/1446; B64D 43/00
See application file for complete search history.

(56) References Cited

U.S. PATENT DOCUMENTS

| | | | |
|---|---|---|---|
| 2,938,686 A * | 5/1960 | Lohstreter et al. | 244/118.1 |
| 4,135,225 A | 1/1979 | Welsh et al. | |
| 4,153,225 A | 5/1979 | Paulsen | |
| 4,479,622 A * | 10/1984 | Howse | 244/129.5 |
| 4,549,602 A * | 10/1985 | Espinoza | 165/80.2 |
| 5,572,769 A * | 11/1996 | Spechts | E05C 17/045 16/337 |
| 5,786,995 A * | 7/1998 | Coleman | 700/83 |

(Continued)

FOREIGN PATENT DOCUMENTS

| | | |
|---|---|---|
| EP | 2474476 | 7/2012 |
| FR | 2975372 | 11/2012 |
| GB | 2491453 | 12/2012 |

OTHER PUBLICATIONS

FR 2975372 A1—english machine translation of specification.*

(Continued)

*Primary Examiner* — Tien Dinh
*Assistant Examiner* — Alexander V Giczy
(74) *Attorney, Agent, or Firm* — Greer, Burns & Crain, Ltd.

(57) ABSTRACT

An electrical and electronics bay of an aircraft has at least two rows of systems elements, each row being separated by a single corridor extending an entire longitudinal length of the electrical and electronics bay and being devoid of the systems elements. Each row has at least one set of systems elements and at least one electrical power center, wherein the systems elements are arranged in cabinets. At least one of the cabinets includes at least one removable mobile shelf for allowing access from a front to the back of the cabinets. Bottom edges of back faces of the cabinet are arranged against the fuselage to remove an additional corridor at the back of the cabinet, and front faces of the cabinet are directly accessible from the single corridor.

23 Claims, 6 Drawing Sheets

(56) References Cited

U.S. PATENT DOCUMENTS

| | | | | |
|---|---|---|---|---|
| 6,076,906 A * | 6/2000 | Royal | ............... | A47B 46/00 312/223.1 |
| 6,513,755 B1 * | 2/2003 | Lambiaso | ............ | B64D 9/003 211/168 |
| 8,074,930 B2 * | 12/2011 | Sibley | ............ | 244/129.5 |
| 2003/0042359 A1 * | 3/2003 | Lambiaso | ............ | 244/118.1 |
| 2003/0052543 A1 * | 3/2003 | Boost | ............ | 307/42 |
| 2008/0211309 A1 * | 9/2008 | Nolte | ............ | 307/66 |
| 2009/0310929 A1 * | 12/2009 | Reinhardt et al. | ............ | 385/135 |
| 2009/0321371 A1 * | 12/2009 | Rathbone et al. | ............ | 211/26.2 |
| 2010/0321892 A1 * | 12/2010 | Vander Ploeg et al. | ............ | 361/707 |
| 2012/0170227 A1 | 7/2012 | Bayliss et al. | | |
| 2013/0032310 A1 * | 2/2013 | Jaena et al. | ............ | 165/104.25 |
| 2013/0213907 A1 * | 8/2013 | Masse et al. | ............ | 211/26 |
| 2014/0340838 A1 * | 11/2014 | Deng | ............ | H05K 5/0204 361/679.33 |

OTHER PUBLICATIONS

French Search Report, Aug. 8, 2013.

\* cited by examiner

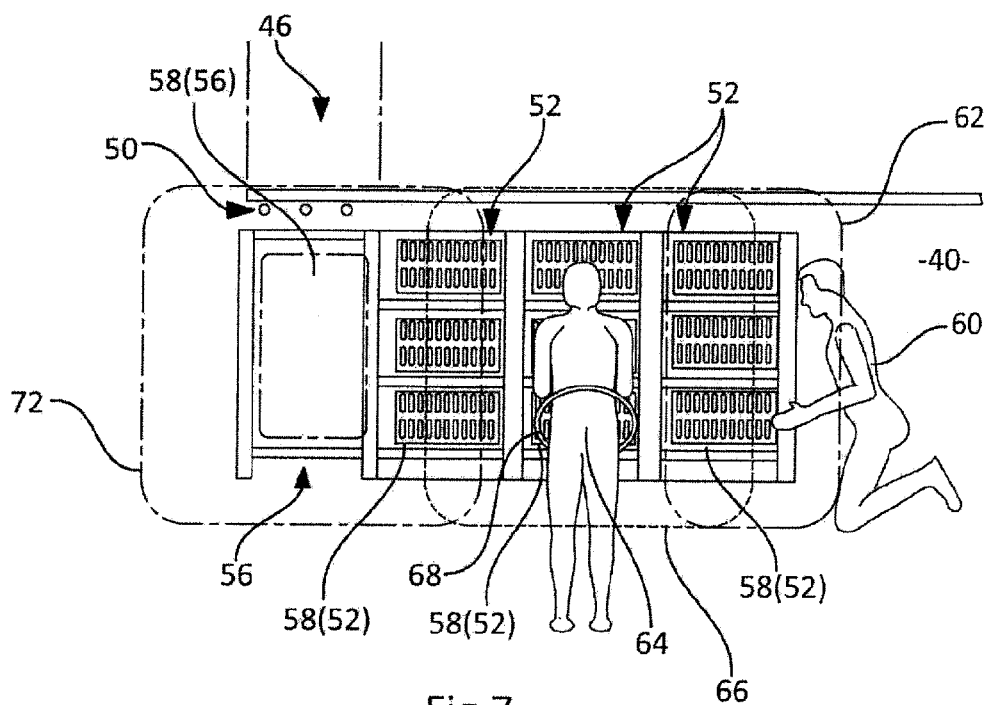
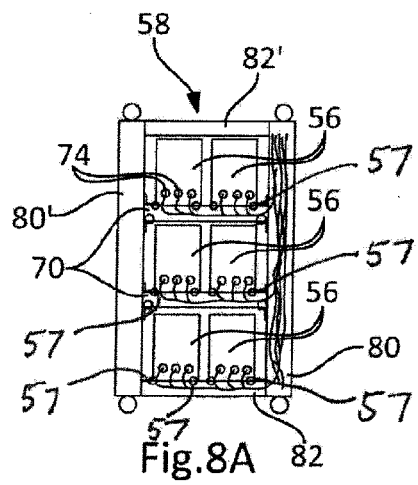
Fig.8A
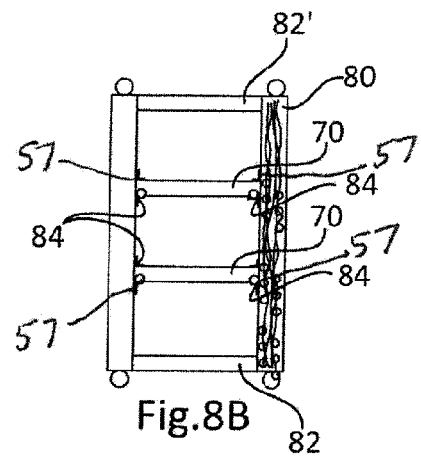
Fig.8B
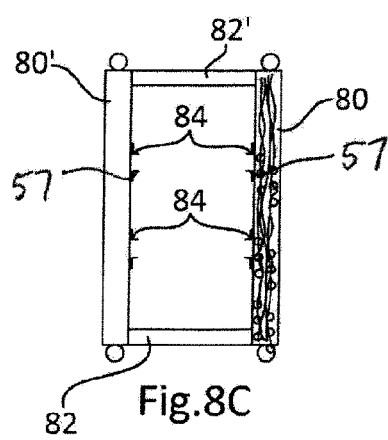
Fig.8C
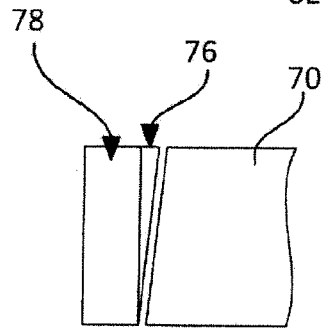
Fig.8D
Fig.7

ELECTRICAL AND ELECTRONICS BAY OF AN AIRCRAFT WITH AN IMPROVED ARCHITECTURE AND AIRCRAFT INCORPORATING SAID BAY

CROSS-REFERENCES TO RELATED APPLICATIONS

This application claims the benefit of the French patent application No. 1262552 filed on Dec. 21, 2012, the entire disclosures of which are incorporated herein by way of reference.

BACKGROUND OF THE INVENTION

The present invention relates to an electrical and electronics bay of an aircraft with an improved architecture and an aircraft incorporating said bay.

As illustrated in FIG. 1, a civil airplane comprises a nose cone 10 comprising in the upper part a cockpit 12 arranged in front of a cabin 14 intended for passengers and in the lower part an electrical and electronics bay 16 (E&E bay) arranged under the cockpit 12, possibly partly under the cabin 14, and in front of a baggage hold 18.

For the remainder of the description, the electrical and electronics bay will be named as the E&E bay. The longitudinal direction DL corresponds to the direction which goes from the nose cone of the aircraft to the tail cone. A transverse plane is equivalent to a plane perpendicular to the longitudinal direction.

In this E&E bay 16 are situated various hardware items necessary, notably for piloting the airplane, for managing the electrical energy and the other networks such as the communications and fluidic networks. Thus, as illustrated in FIG. 3, the E&E bay 16 comprises avionics cabinets 20C, 20D, 20G incorporating computers, electrical power centers 22D, 22G, additional elements 24D, 24G to the electrical power centers such as batteries or power transformers, as well as electrical, communications and fluidic networks linking these various elements 20C, 20D, 20G, 22D, 22G, 24D, 24G. The fluidic networks are specifically provided to ensure the cooling of all these elements.

According to one embodiment, the electrical power centers 22D and 22G occupy a substantially parallelepipedal volume in the manner of a cabinet. The same is true for the avionics cabinets 20C, 20D and 20G. The additional elements 24D and 24G have more complicated shapes and are not organized in cabinet shapes.

According to a first constraint related to safety, the electrical and electronics systems present on board of an aircraft (particularly the most sensitive) are redundant. Thus, the E&E bay 16 comprises two electrical power centers, at least two avionics cabinets (or even three in the example illustrated in FIG. 3) and two sets of additional elements of the electrical power centers.

According to a second constraint related to the segregation principle, the E&E bay 16 comprises two sets, a right set 26D with an electrical power center 22D, an avionics cabinet 20D and additional elements 24D of the electrical power center 22D, and a left set 26G with an electrical power center 22G, an avionics cabinet 20G and additional elements 24G of the electrical power center 22G, the electrical power centers of the two sets having to be separated by a minimum regulation distance in the order of a meter.

According to another constraint related to the correct operation of the electrical and electronics elements, they must be temperature-regulated. Consequently, the avionics cabinets and the electrical power centers are linked to means for evacuating the heat released by these elements which generally appear in the form of air ducts.

According to another constraint related to maintenance, it is necessary to be able to access all the elements present in the E&E bay.

Taking these constraints into account, as illustrated in FIG. 3, the E&E bay 16 comprises four corridors C1 to C4 bordering five rows R1 to R5 of elements oriented along the longitudinal direction DL. Thus, the E&E bay 16 comprises, from left to right, a row R1 of additional elements 24G, a corridor C1, a row R2 incorporating the electrical power center 22G, a corridor C2, a row R3 incorporating a central avionics cabinet 20C, a corridor C3, a row R4 incorporating the electrical power center 22D, a corridor C4, a row R5 of additional elements 24D. The avionics cabinets 20G and 20D are oriented in such a way that their lengths are perpendicular to the longitudinal direction DL and are separated from the rows R2 to R4. The avionics cabinet 20G is arranged facing the corridors C1 and C2 and facing the row R2, the avionics cabinet 20D is arranged facing the corridors C3 and C4 and facing the row R4.

This architecture makes it possible to access all the elements present in the E&E bay 16 as well as the two faces of each electrical power center and of each avionics cabinet, which simplifies maintenance.

According to another aspect, this architecture makes it possible to satisfy another constraint concerning the accessibility of the clean water supply circuit and of the draining circuit for waste water from the toilets situated at the back of the cockpit. Thus, using the corridors C1 and C4, it is possible to access these elements situated under the cabin floor during maintenance operations.

Taking into account the growing need for electrical and electronic functions on aircraft, the volumes occupied by the various elements present in the E&E bay tend to significantly increase despite the permanent progress made in the field of electronics component incorporation.

However, due to economic constraints, it is necessary to avoid increasing the volume of the E&E bay (or even to reduce it) in order to avoid reducing the volume of the zones that ensure the profitability of the aircraft such as the passenger cabin and the baggage hold.

Consequently, in order to achieve this goal, it is necessary to increase the density of the elements present in the E&E bay 16.

A first solution could be to reduce the width of the corridors. However, this solution is not optimal because it is necessary to conserve a minimum width between the rows to be able to install the various elements in the E&E bay and to carry out maintenance. Moreover, the minimum width of the corridors C2 and C3 is imposed by the segregation principle.

SUMMARY OF THE INVENTION

The present invention aims to remedy the drawbacks of the prior art by proposing a solution that aims to optimize the density of the elements present in an electrical and electronics bay of an aircraft.

With this aim, the subject of the invention is an electrical and electronics bay which is characterized in that it comprises two rows of elements, each row being separated by a single corridor and comprising at least one set of systems elements and at least one electrical power center, and in that the systems elements are arranged in cabinets, at least one cabinet comprising mobile shelves for allowing access to the back of the cabinet by crossing it.

This new architecture of the invention makes it possible to increase the density of the elements in the electrical and electronics bay, while observing the principles of segregation and redundancy.

According to a first variant, a cabinet comprises two struts and mobile shelves mounted on sliders fastened to the struts.

According to another variant, a cabinet comprises two struts and shelves mounted to pivot around a pivot axis provided at the front face of the cabinet and to one side of the mobile shelves. According to this variant, the mobile shelves are preferably interlinked.

According to one embodiment, the elements mounted on the mobile shelves are linked to a cable harness provided at the strut bearing the pivot axis.

According to another embodiment, the elements mounted on the mobile shelves are linked to a cable harness provided at a strut not bearing the pivot axel. In this case, the electrical connections are interspaced between the elements and the cable harness.

Another subject of the invention is an aircraft incorporating an electrical and electronics bay as defined previously.

Preferably, the aircraft fuselage comprises at least one manhole for allowing access to the back of the rows, said manhole being closed by a removable hatch.

Advantageously, the electrical and electronics bay according to the invention comprises a cabinet with mobile shelves arranged under each toilet in order to allow access to the maintenance point of the toilets when the shelves are removed.

BRIEF DESCRIPTION OF THE DRAWINGS

Other features and advantages will appear from the following description of the invention, given solely by way of example, with reference to the appended drawings in which:

FIG. 7 is a schematic representation showing the accessibility of the elements of an electrical and electronics bay of an aircraft according to the invention, FIG. 8A is a schematic front view of a cabinet according to a first variant of the invention, FIG. 8B is a front view of the cabinet of FIG. 8A without the appliances, FIG. 8C is a front view of the cabinet of FIG. 8A without the appliances and without the shelves, FIG. 8D is a back view of a shelf of a cabinet according to the invention.

DETAILED DESCRIPTION OF THE PREFERRED EMBODIMENTS

Figure 1:
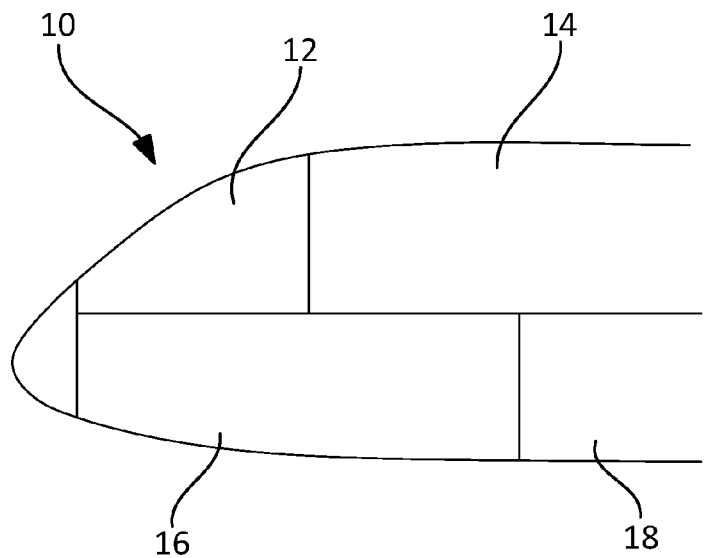
FIG. 1 is a schematic section of a nose cone of an aircraft according to the prior art.
Figure 2:
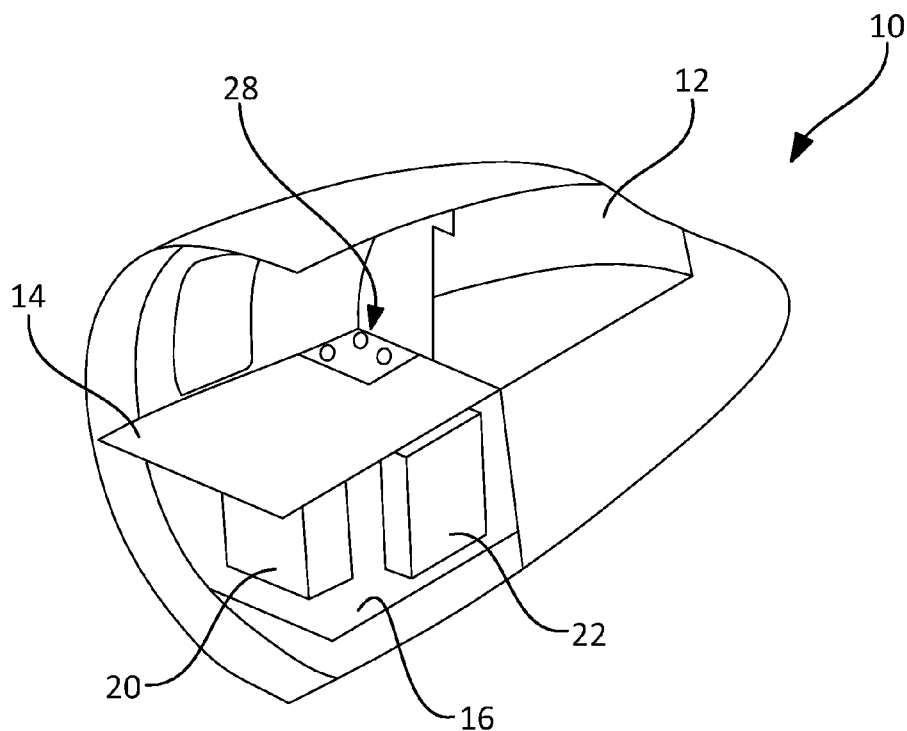
FIG. 2 is a perspective half-view of a nose cone of an aircraft according to the prior art.
Figure 3:
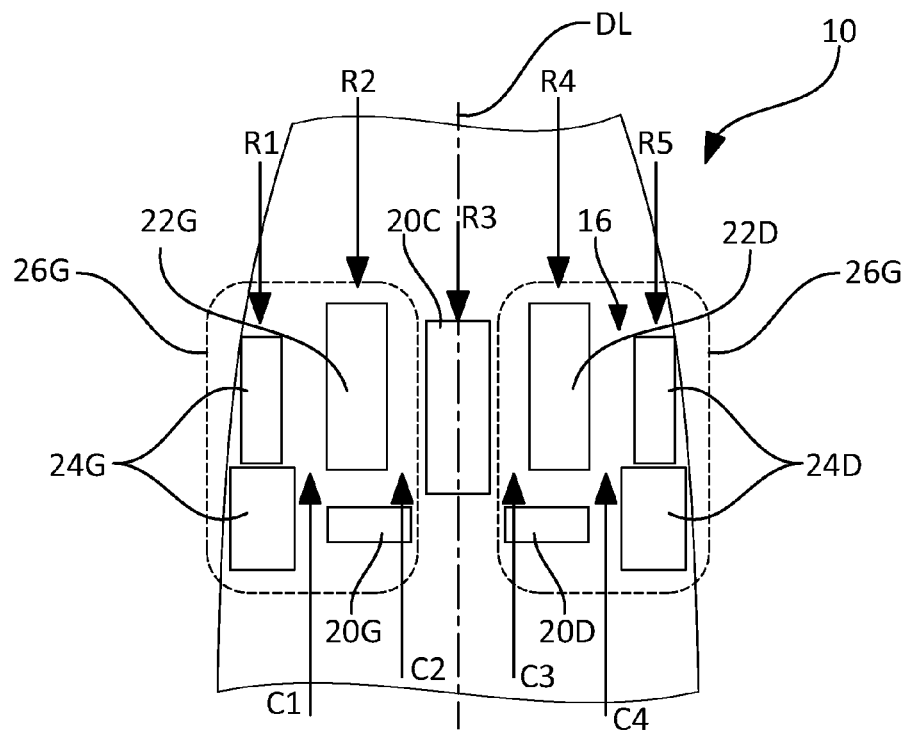
FIG. 3 is a top view illustrating the architecture of an electrical and electronics bay of an aircraft according to the prior art.
Figure 4:
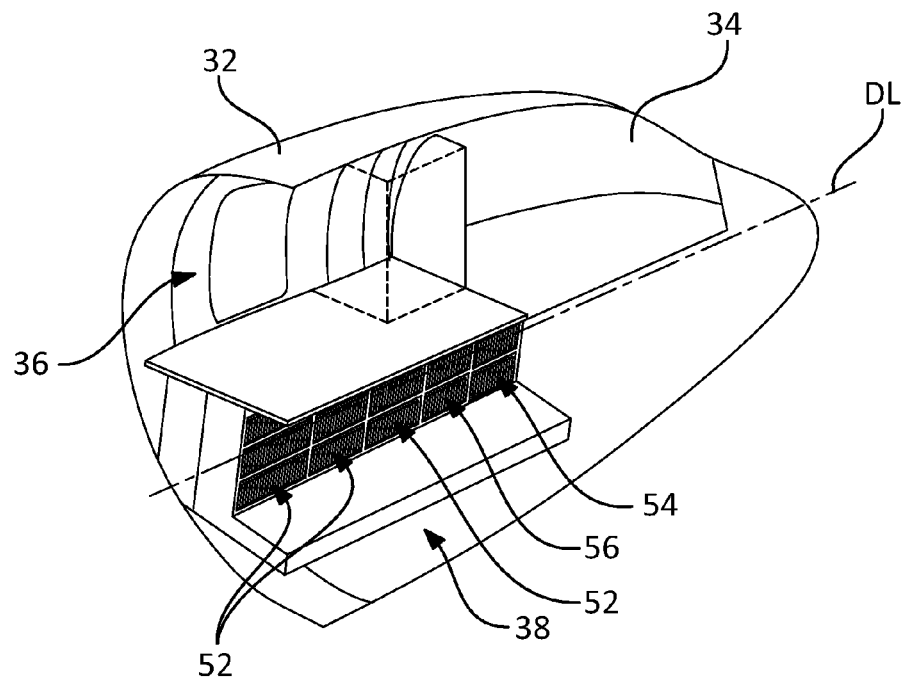
FIG. 4 is a perspective half-view of a nose cone of an aircraft according to the invention.
Figure 5:
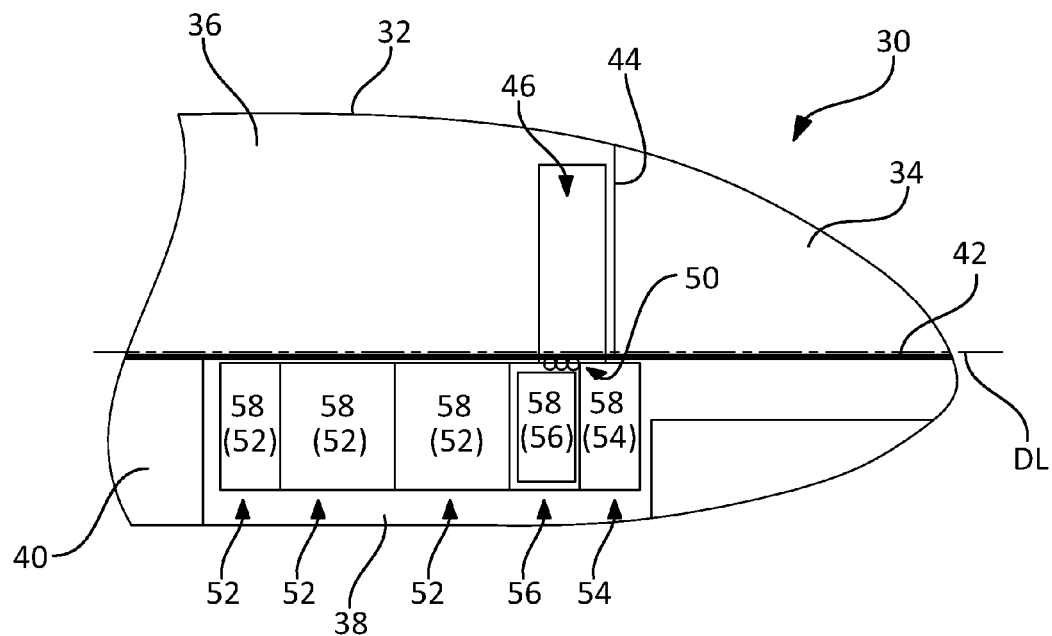
FIG. 5 is a schematic section of a nose cone of an aircraft according to the invention.
Figure 6:
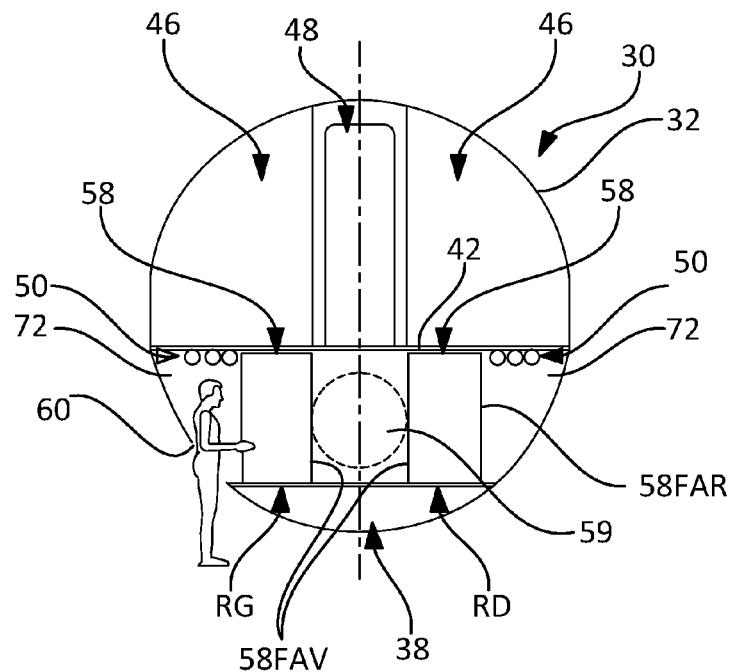
FIG. 6 is a cross section of a nose cone of an aircraft according to the invention.

In FIGS. 4 to 6, a nose cone 30 of an aircraft is shown delimited by a fuselage 32. As with the prior art, the upper part contains a cockpit 34 with at the back a cabin 36 intended for passengers and the lower part contains an electrical and electronics bay 38, also called E&E bay, with a hold 40 at the back.

The upper part and the lower part are separated by a floor 42.

The cockpit 34 and the cabin 36 are separated by a partition 44. Toilets and/or bays 46 are generally provided in the cabin 36, bonded to the partition 44, on either side of a corridor 48 provided for accessing the toilets and/or bays 46 and the cockpit 34.

With each toilet 46 is associated at least one maintenance point 50 that is suitable for access. A maintenance point 50 corresponds to a clean water supply or a waste water drain. It is situated under the floor 42 perpendicular to the toilet 46 with which it is associated. Generally, each toilet 46 comprises several maintenance points 50.

The E&E bay 38 comprises at least two sets of avionics elements 52, at least two electrical power centers 54 and at least two sets of additional elements 56 to the electrical power centers.

The avionics elements 52 comprise computers, among other things.

The additional elements 56 to the electrical power centers comprise among other things batteries or power transformers.

The avionics elements 52 and/or the additional elements 56 to the electrical power centers are also called systems elements.

An electrical power center can be considered as a cabinet given its parallelepipedal geometrical shape. In a variant, the components of an electrical power center can be incorporated into a cabinet.

Advantageously, all the elements 52 and 56 (preferably the elements of the electrical power center) are arranged in cabinets 58, even the sets of additional elements 56 to the electrical power centers which were dispersed according to the prior art. Preferably, the various cabinets 58 have an approximately identical cross section (in a transversal plane).

Each cabinet 58 appears in the shape of a parallelepiped with two large faces, a back face 58FAR and a front face 58FAV, said faces being parallel with the longitudinal direction DL.

All the cabinets 58 are arranged along only two rows, a right row RD and a left row RG, which are oriented along the longitudinal direction DL and separated by a single central corridor 59. Thus, according to the invention, each row is arranged as close to the fuselage 32 as possible, which makes it possible to remove a corridor at the back of the cabinets. According to this arrangement, the bottom edges of the back faces 58FAR of the cabinets 58 are arranged against the fuselage. The front faces 58FAV of the cabinets 58 are directly accessible from the single central corridor 59.

As illustrated in FIG. 5, each row RD or RG comprises several cabinets 58.

To observe the principles of segregation and redundancy, each row RD or RG comprises an electrical power center 54, at least one set of additional elements 56 to the electrical power center, preferably bonded against the electrical power center 54, and at least one set of avionics elements 52.

According to an embodiment illustrated in FIG. 5, each row comprises from the front to the back of the aircraft a cabinet 58(54) containing an electrical power center 54, a cabinet 58(56) containing additional elements 56 to the electrical power center, and three cabinets 58(52) containing avionics elements 52.

The new architecture of the invention makes it possible to increase the density of the elements 52, 54, 56 in the E&E bay, while observing the principles of segregation and redundancy. According to another advantage, this architecture improves accessibility to the front faces 58FAV of the various cabinets 58.

According to another aspect, the electrical and electronics components of the elements 52, 54 and 56 are arranged in the cabinets depending on the frequency of their maintenance. Thus, the components that require frequent maintenance will be arranged at the front faces 58FAV of the cabinets, whereas the components that require less frequent maintenance will be arranged at the back close to the back faces 58FAR.

For the remainder of the description, only one row is described. Of course, the two rows can be identical.

Concerning the accessibility of the elements that are not directly accessible from the front face of the cabinets 58, as illustrated in FIG. 7, an operator 60 will be able to intervene from the hold 40 to act in a zone 62 corresponding to the back face of the cabinet 58 situated the furthest back. With this aim, at least one hatch can be mounted at the partition separating the E&E bay and the hold. As a variant, as illustrated in FIG. 7, an operator 64 will be able to act in a zone 66 by passing through a manhole 68 made in the fuselage 32 of the aircraft. This manhole 68 is closed by a removable hatch with screws. As needed, an aircraft may comprise one or more manholes depending on the length of the rows.

According to another variant as illustrated in FIGS. 8A-8D, at least one cabinet 58 comprises mobile shelves 70. When the shelves 70 are removed, it is possible to access a zone 72 situated at the back of said cabinet 58 and any neighboring cabinets.

Preferably, the cabinet 58 arranged under the toilets 46 comprises mobile shelves 70. When the shelves 70 are removed, it is possible to access the maintenance point 50 of the toilets.

Advantageously, this cabinet 58 comprises the additional elements 56 to the electrical power centers. Unlike the other elements 52 and 54, the additional elements 56 are not linked to the electrical network of the aircraft with many wires. By way of example, each element 56 is connected to the rest of the aircraft by a control connection and by two power connections.

As illustrated in FIGS. 8A-8D, the elements 56 are fastened to plug-in holders 57, locks being provided at the front face for immobilizing the plug-in holders 57 on the shelves. Preferably, this cabinet 58 comprises electrical connectors 74 arranged at the front face.

Advantageously, at least one shelf 70 comprises a cavity through which a stream of air may flow for cooling the elements 56.

According to one embodiment, at least one mobile shelf 70 comprises at the back a connection 76 with a fluidic network 78, as illustrated in FIG. 8D.

According to a first variant illustrated in FIGS. 8A and 8C, the cabinet 58(56) comprises two struts 80, 80' and advantageously, two fixed shelves 82, 82' at the bottom and the top. Thus, the struts 80, 80' and the fixed shelves 82, 82' form a frame that allows an operator to cross the cabinet 58 to gain access to the back of the cabinets and the maintenance point of the toilets.

The cabinet 58 comprises two mobile shelves 70 mounted on sliders 84 fastened to the struts. The elements 56 are positioned on the shelves 70 and 82.

According to this variant, to cross the cabinet 58, it is possible to disconnect the elements 56 and to retract them from the cabinet, as illustrated in FIG. 8B. Next, the mobile shelves 70 are removed as illustrated in FIG. 8C, so as to allow an operator to cross the cabinet 58.

Figure 9A:
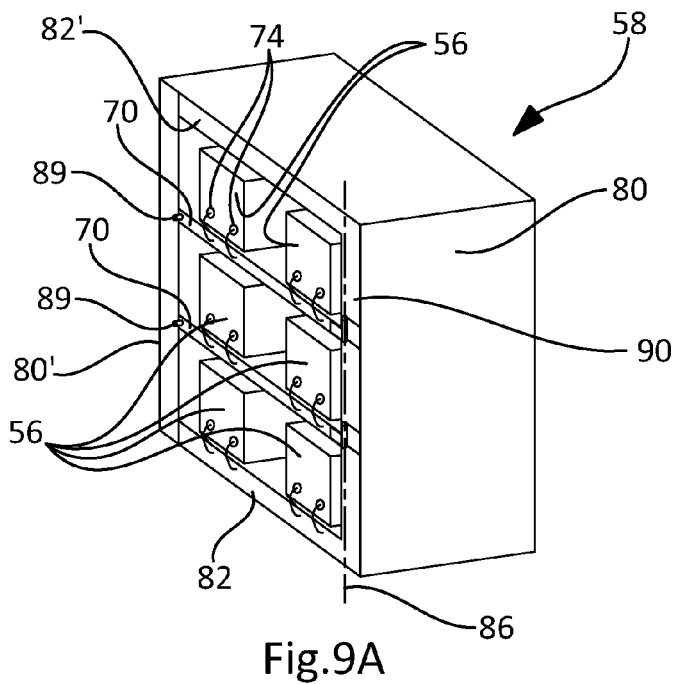
FIG. 9A is a schematic perspective view of a cabinet according to a second variant of the invention.
Figure 9B:
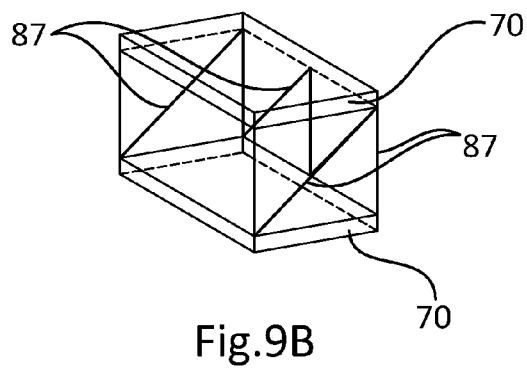
FIG. 9B is a schematic perspective view of the shelves of the cabinet of FIG. 9A.
Figure 9C:
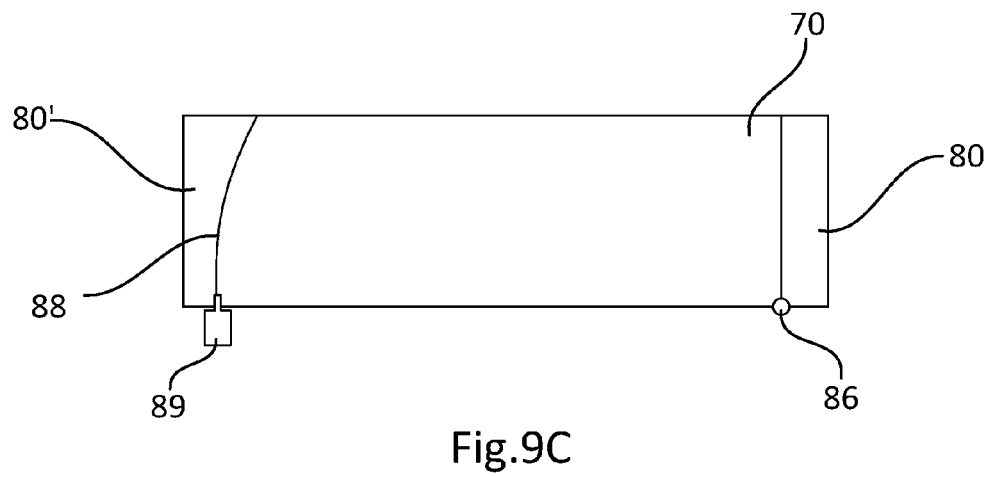
FIG. 9C is a schematic top view of a cabinet of FIG. 9A.

According to a second variant illustrated in the FIGS. 9A, 9B and 9C, the mobile shelves 70 are mounted pivoting around a pivot axis 86 provided at the front face and to one side of the mobile shelves 70.

As illustrated in FIGS. 9A-9C, the cabinet 58 comprises two struts 80, 80' and advantageously, two fixed shelves 82, 82' at the bottom and the top. Thus, the struts 80, 80' and the fixed shelves 82, 82' form a frame that allows an operator to cross the cabinet 58 to have access to the back of the cabinets and the maintenance point of the toilets.

Figure 11:
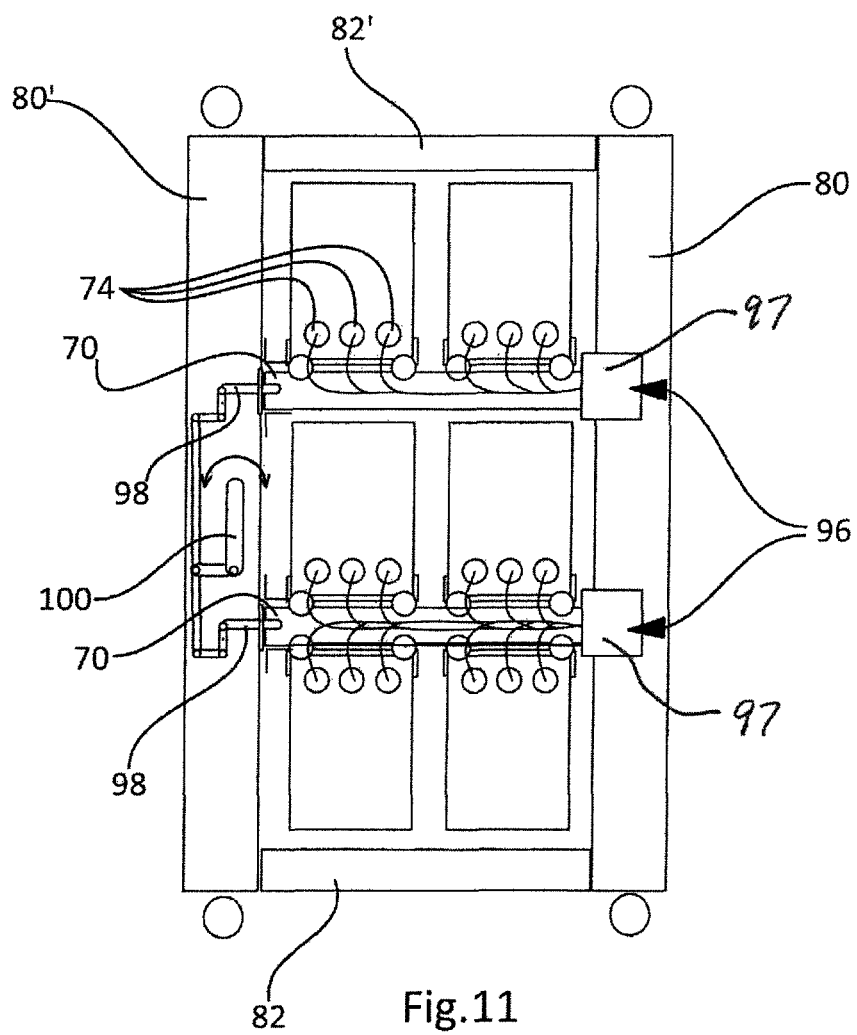
FIG. 11 is a schematic front view of a cabinet according to a fourth variant of the invention.

The mobile shelves 70 are interlinked by a network of rods 87 arranged according to a triangulation principle, so as to form a block, as illustrated in FIG. 9B. The elements 56 are positioned on the mobile shelves 70. The elements 56 arranged above the bottom fixed shelf 82 are suspended on the lower wall of the mobile shelf 70 situated above, as illustrated in FIG. 11.

As illustrated in FIG. 9C, to allow the mobile shelves 70 to pivot, the latter are linked by a hinge at the front face of the cabinet, at the strut 80. These hinges form the pivot axis 86. Each mobile shelf 70 comprises an edge 88 in a circular arc opposite the pivot axis, to allow it to pivot.

At least one lock 89 makes it possible to immobilize the mobile shelves 70.

Unlike the first variant, it is no longer necessary to remove the elements 56. To release the cabinet 58, it is enough to unlock the lock 89 and make the mobile shelves 70 pivot around the pivot axis 86.

Generally, the elements 56 are linked to the electrical network of the aircraft by way of a cable harness 90 of cables provided at one of the struts 80. According to the variant illustrated in FIG. 9A, the strut 80, along which the cable harness 90 extends, bears the pivot axis 86.

According to this second variant, the connection 76 with a fluidic network 78 provided at the back of the mobile shelves 70 is of circular arc geometry, depending on the kinematics of the shelves.

Figure 10:
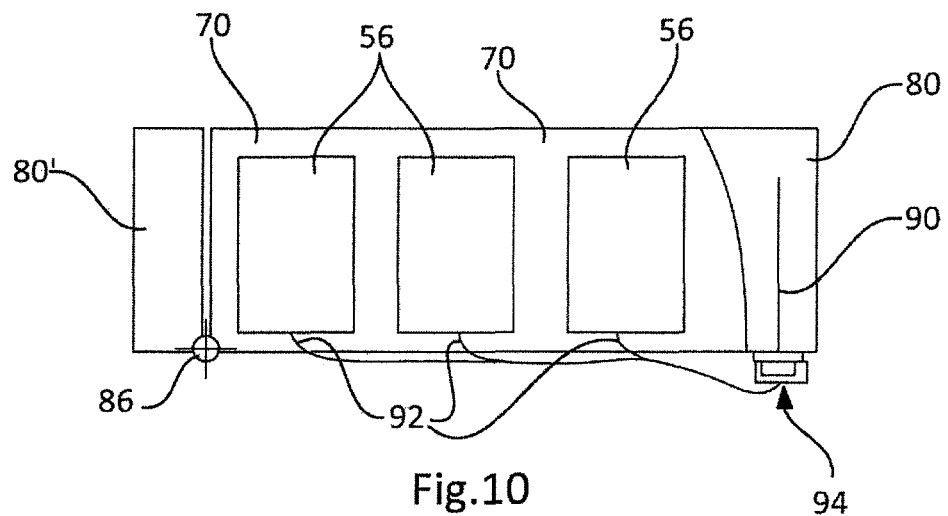
FIG. 10 is a schematic top view of a cabinet according to a third variant of the invention.

According to a third variant illustrated in FIG. 10, the pivot axis 86 is provided at the strut 80' opposite the strut along which the cable harness 90 extends. In this case, electrical connections 94 are provided between the elements 56 and the cable harness 90. According to this variant, the harness 90 is preferably incorporated in the strut 80. The electrical wires 92 are substantially fixed with respect to the mobile shelves 70, in such a way that the connection and the disconnection of the electrical connections 94 are performed automatically.

According to a fourth variant illustrated in FIG. 11, as with the third variant, the harness is incorporated into the strut 80. This same strut 80 bears the hinges 96 for making the mobile shelves 70 pivot around a pivot axis 86 provided at the strut 80. According to this variant, each hinge 96 comprises an articulated electrical connector 97 that performs the function of mechanical hinge but also of electrical hinge.

Advantageously, a latch 98 is provided for each mobile shelf, the various latches 98 all being controlled by a single control in the form of a pivoting handle 100.

As is apparent from the foregoing specification, the invention is susceptible of being embodied with various alterations and modifications which may differ particularly from those that have been described in the preceding specification and description. It should be understood that I wish to embody within the scope of the patent warranted hereon all such modifications as reasonably and properly come within the scope of my contribution to the art.

The invention claimed is:

1. An electrical and electronics bay of an aircraft being delimited by a fuselage and comprising:
    at least two sets of systems elements having electrical and electronics components, and at least two electrical power centers;
    wherein said at least two sets of systems elements and said at least two electrical power centers are arranged in two rows, each row being separated by a single corridor extending an entire longitudinal length of the electrical and electronics bay and being devoid of the systems elements, each row having at least one set of systems elements and at least one electrical power center, and
    wherein the systems elements are arranged in a plurality of cabinets, at least one of the plurality of cabinets including at least one of a first removable mobile shelf that is mounted on sliders and configured for allowing access from a front to a back of the corresponding cabinet by crossing the corresponding cabinet, at least another one of the plurality of cabinets including at least one of a second removable mobile shelf that is mounted around a pivot axis and configured for allowing access from the front to the back of the corresponding cabinet by crossing the corresponding cabinet, and
    bottom edges of back faces of the plurality of cabinets are arranged against the fuselage to preclude an additional corridor at the back of the corresponding cabinet, and front faces of the plurality of cabinets are directly accessible from the single corridor, and
    wherein the at least another one of the plurality of cabinets includes at least two struts, and the pivot axis is disposed on one side of the corresponding cabinet and on one of the at least two struts.

2. The electrical and electronics bay according to claim 1, wherein the electrical and electronics components are arranged in the plurality cabinets depending on a frequency of associated maintenance.

3. The electrical and electronics bay according to claim 1, wherein the at least one cabinet with the at least one first or second mobile shelf further comprises additional electrical and electronics components connected to the electrical power centers.

4. The electrical and electronics bay according to claim 1, wherein the at least one cabinet with the at least one first mobile shelf includes at least two struts and at least two first mobile shelves mounted on sliders fastened to the struts.

5. The electrical and electronics bay according to claim 4, wherein at least one of the systems elements is fastened to a plug-in holder on at least one of the first or second mobile shelf.

6. The electrical and electronics bay according to claim 1, wherein the pivot axis is provided at a front face of the corresponding cabinet and to one side of the at least one mobile shelf.

7. The electrical and electronics bay according to claim 1, further comprising at least two first mobile shelves that are interlinked, or at least two second mobile shelves that are interlinked.

8. The electrical and electronics bay according to claim 6, wherein the systems elements are linked to a cable harness of cables provided at the strut having the pivot axis of the corresponding cabinet.

9. The electrical and electronics bay according to claim 8, wherein the strut having the pivot axis of the corresponding cabinet has hinges for making the mobile shelves pivot around the pivot axis, each hinge including an articulated connector that performs the function of a mechanical hinge and an electrical hinge.

10. The electrical and electronics bay according to claim 1, wherein the systems elements are linked to a cable harness of cables provided at one of the struts that does have the pivot axis of the corresponding cabinet and wherein electrical connections are interspaced between the systems elements and the cable harness.

11. An aircraft comprising an electrical and electronics bay according to claim 1.

12. The aircraft according to claim 11, wherein the fuselage includes at least one manhole for allowing access to the back of the corresponding row, said manhole being closed by a removable hatch.

13. The aircraft according to claim 11, said aircraft having a toilet arranged above the electrical and electronics bay, the toilet being associated with at least one maintenance point, wherein said electrical and electronics bay includes the at least one of the plurality of cabinets with the at least one first or second mobile shelf arranged under the toilet allowing access to the at least one maintenance point when the at least one first or second mobile shelf is removed.

14. An electrical and electronics bay of an aircraft being delimited by a fuselage and comprising:
    at least two sets of systems elements having electrical and electronics components, and at least two electrical power centers;
    wherein said at least two sets of systems elements and said at least two electrical power centers are arranged in two rows, each row being separated by a single corridor extending an entire longitudinal length of the electrical and electronics bay and being devoid of the systems elements, each row having at least one set of systems elements and at least one electrical power center, and
    wherein the systems elements are arranged in a plurality of cabinets, at least one of the plurality of cabinets including at least one removable mobile shelf that is mounted to pivot around a pivot axis and configured for allowing access from a front to a back of the corresponding cabinet by crossing the corresponding cabinet, and
    bottom edges of back faces of the plurality of cabinets are arranged against the fuselage to preclude an additional corridor at the back of the corresponding cabinet, and front faces of the plurality of cabinets are directly accessible from the single corridor, and
    wherein the at least one of the plurality of cabinets includes at least two struts and the pivot axis is disposed on one side of the corresponding cabinet and on one of the at least two struts.

15. The electrical and electronics bay according to claim 14, wherein the electrical and electronics components are arranged in the plurality of cabinets depending on a frequency of associated maintenance.

16. The electrical and electronics bay according to claim 14, wherein the cabinet with the at least one mobile shelf further comprises additional electrical and electronics components connected to the electrical power centers.

17. The electrical and electronics bay according to claim 14, wherein the mobile shelves are interlinked.

18. The electrical and electronics bay according to claim 14, wherein the systems elements are linked to a cable harness of cables provided at the strut having the pivot axis.

19. The electrical and electronics bay according to claim 18, wherein the strut having the pivot axis has hinges for making the mobile shelves pivot around the pivot axis, each hinge including an articulated connector that performs the function of a mechanical hinge and an electrical hinge.

20. The electrical and electronics bay according to claim 14, wherein the systems elements are linked to a cable harness of cables provided at one of the struts that does not have the pivot axis and wherein electrical connections are interspaced between the systems elements and the cable harness.

21. An aircraft comprising an electrical and electronics bay according to claim 14.

22. The aircraft according to claim 21, wherein the fuselage includes at least one manhole for allowing access to the back of the corresponding row, said manhole being closed by a removable hatch.

23. The aircraft according to claim 21, said aircraft having a toilet arranged above the electrical and electronics bay, the toilet being associated with at least one maintenance point, wherein said electrical and electronics bay includes the at least one of the plurality of cabinets with the at least one mobile shelf arranged under the toilet allowing access to the at least one maintenance point when the at least one mobile shelf is removed.

* * * * *